United States Patent
Iesaka et al.

(10) Patent No.: US 11,335,821 B2
(45) Date of Patent: May 17, 2022

(54) LOW NOISE SILICON GERMANIUM IMAGE SENSOR

(71) Applicant: OMNIVISION TECHNOLOGIES, INC., Santa Clara, CA (US)

(72) Inventors: Mamoru Iesaka, Tokyo (JP); Woon Il Choi, Sunnyvale, CA (US); Sohei Manabe, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 156 days.

(21) Appl. No.: 16/863,771

(22) Filed: Apr. 30, 2020

(65) Prior Publication Data

US 2021/0343882 A1  Nov. 4, 2021

(51) Int. Cl.
*H01L 31/028* (2006.01)
*H01L 27/146* (2006.01)

(52) U.S. Cl.
CPC ...... *H01L 31/028* (2013.01); *H01L 27/14612* (2013.01); *H01L 27/14649* (2013.01); *H01L 27/14685* (2013.01); *H01L 27/14689* (2013.01)

(58) Field of Classification Search
CPC ............. H01L 31/028; H01L 27/14612; H01L 27/14649; H01L 27/14685; H01L 27/14689
See application file for complete search history.

(56) References Cited

U.S. PATENT DOCUMENTS

| | | | |
|---|---|---|---|
| 5,049,962 A * | 9/1991 | Huang | H01L 31/1032 257/463 |
| 9,911,770 B2 | 3/2018 | Yang et al. | |
| 2017/0141153 A1 | 5/2017 | Lee et al. | |
| 2017/0345851 A1* | 11/2017 | Yang | H01L 27/1461 |

FOREIGN PATENT DOCUMENTS

| | | | | |
|---|---|---|---|---|
| EP | 3012876 A1 * | 4/2016 | ....... | H01L 31/03042 |
| KR | 20030001143 A * | 1/2003 | | |

OTHER PUBLICATIONS

Machine translation of Sugaya, T., "Research Fields, Super Efficiency Technology," The National Institute of Advanced Industrial Science and Technology (AIST) Research Center for Photovoltaics, 2014 <https://unit.aist.go.jp/rcpv/ci/results/past_presentation/2014/R06ssdt.pdf>, 26 pages.

* cited by examiner

*Primary Examiner* — Sitaramarao S Yechuri
(74) *Attorney, Agent, or Firm* — Christensen O'Connor Johnson Kindness PLLC

(57) ABSTRACT

Low noise silicon-germanium (SiGe) image sensor. In one embodiment, an image sensor includes a plurality of pixels arranged in rows and columns of a pixel array disposed in a semiconductor substrate. The photodiodes of an individual pixel are configured to receive an incoming light through an illuminated surface of the semiconductor substrate. The semiconductor substrate includes a first layer of semiconductor material having silicon (Si); and a second layer of semiconductor material having silicon germanium (Si1-

(Continued)

xGex). A concentration x of Ge changes gradually through at least a portion of thickness of the second layer. Each photodiode includes a first doped region extending through the first layer of semiconductor material and the second layer of semiconductor material; and a second doped region extending through the first layer of semiconductor material and the second layer of semiconductor material.

21 Claims, 11 Drawing Sheets

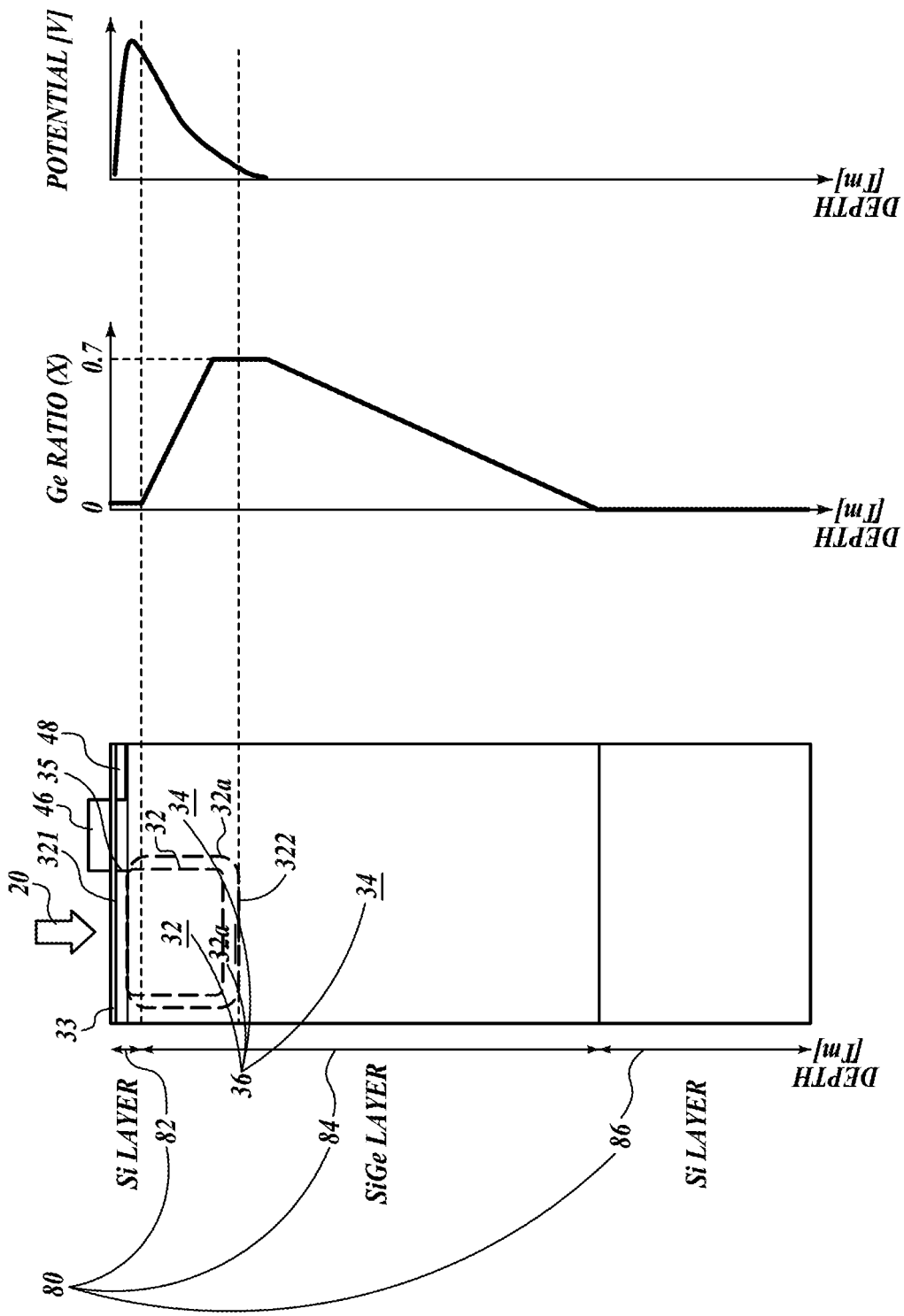

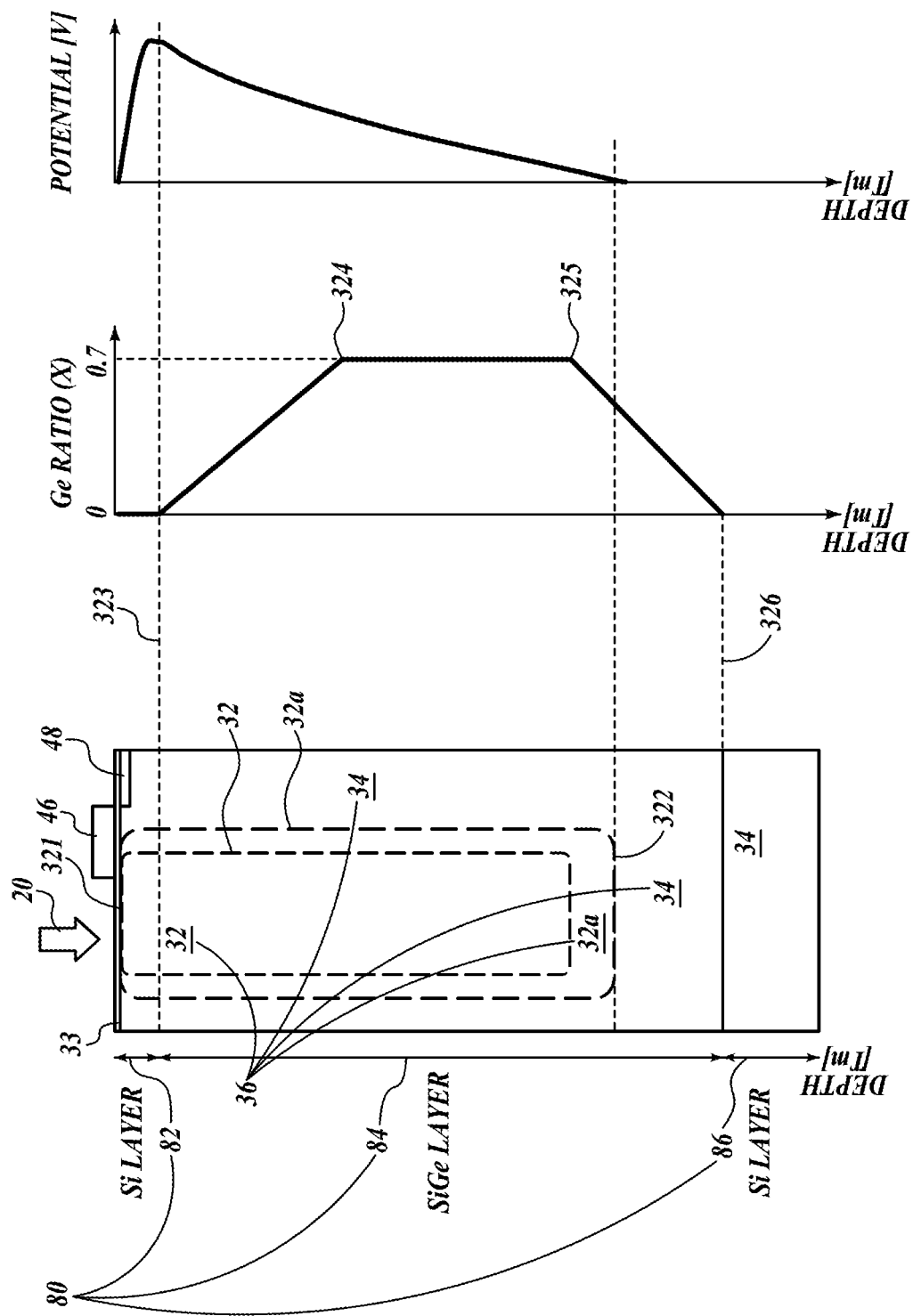

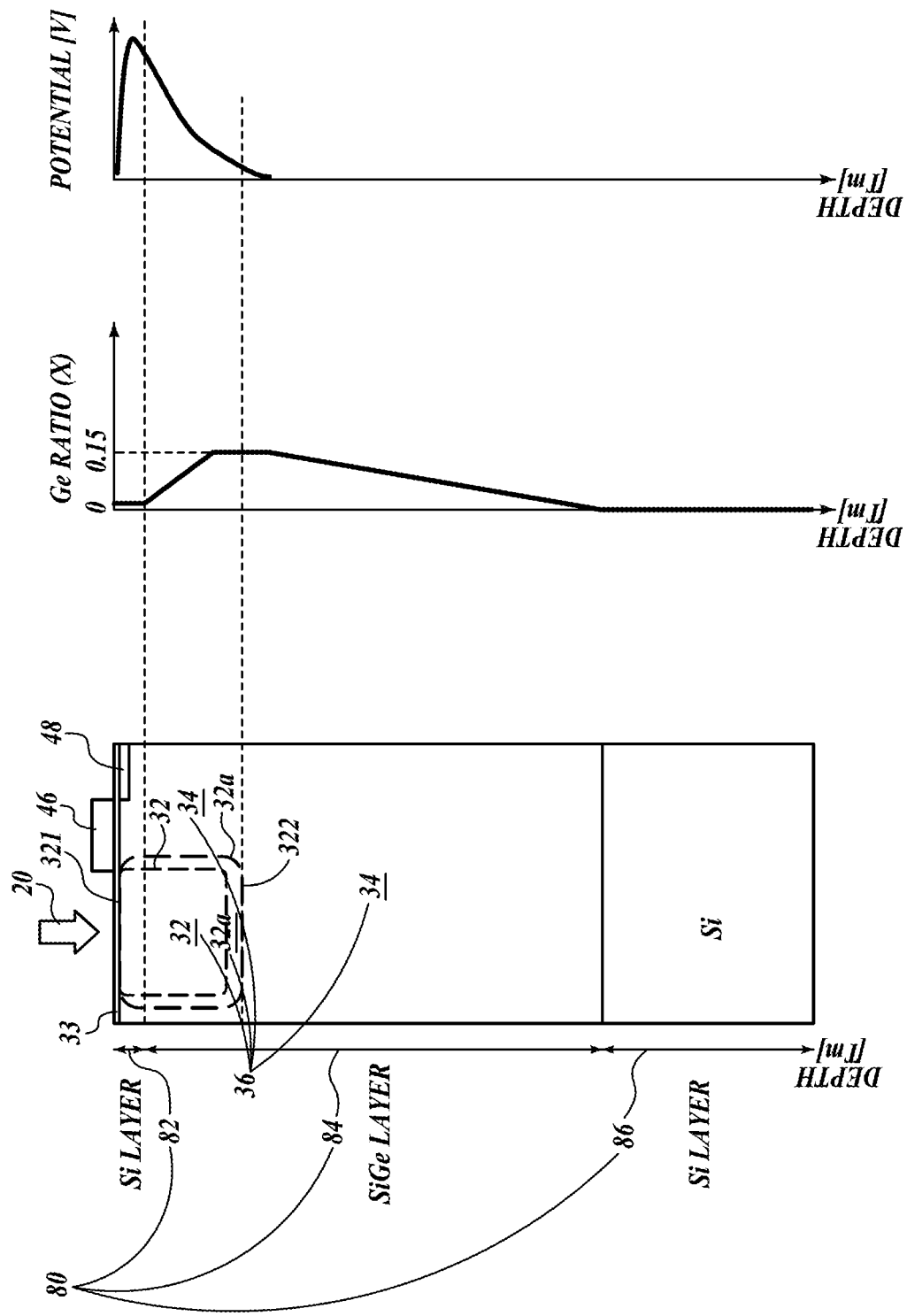

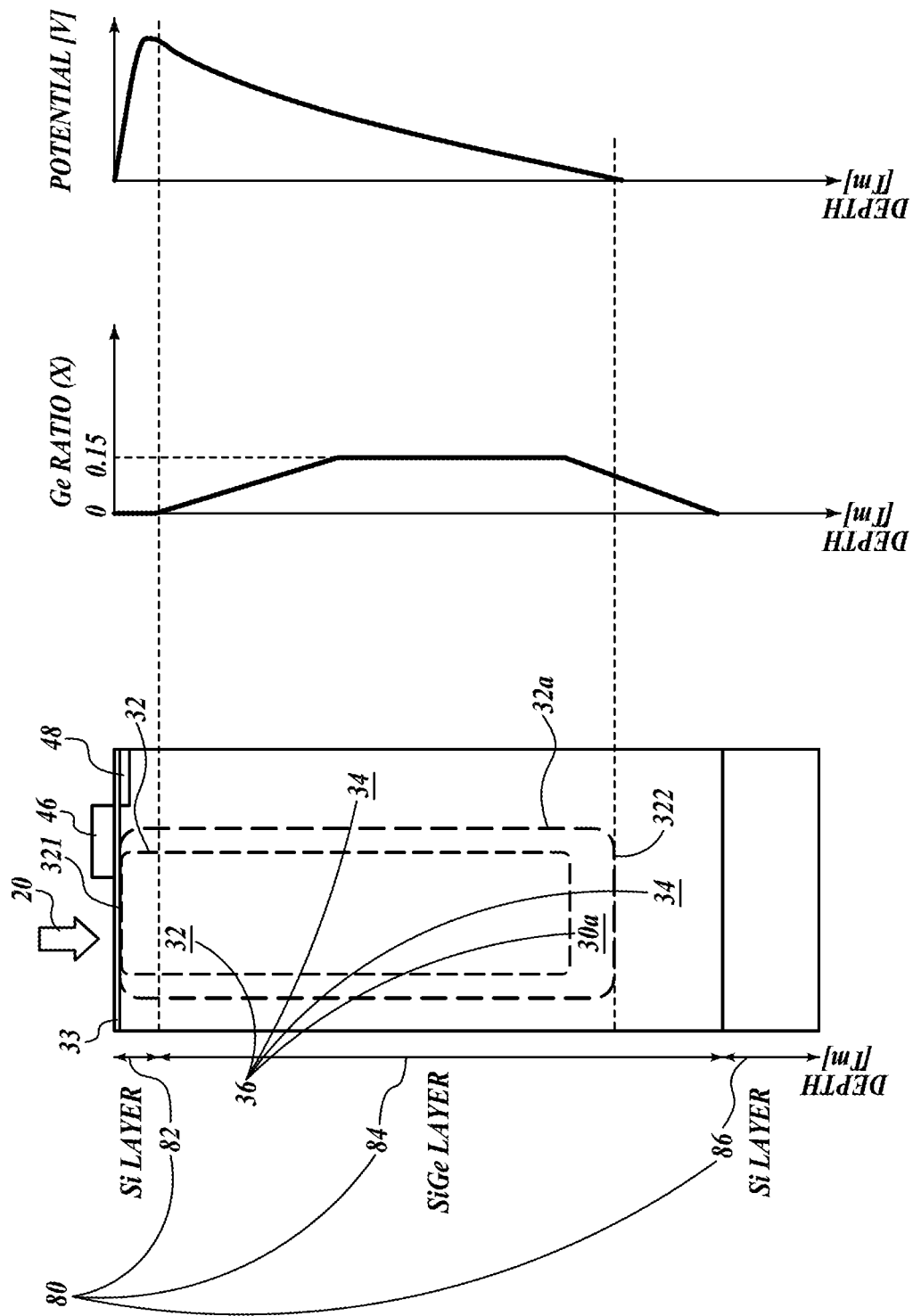

STEP 3

STEP 2

STEP 1

*STEP 5*

*STEP 4*

US 11,335,821 B2

LOW NOISE SILICON GERMANIUM IMAGE SENSOR

BACKGROUND INFORMATION

Field of the Disclosure

This disclosure relates generally to the design of image sensors, and in particular, relates to image sensors that include Silicon Germanium (SiGe) layer.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

In some applications, photodiodes of the image sensor are made of silicon-germanium (SiGe) semiconductor, because of a relatively high sensitivity of the SiGe photodiodes to near infrared rays (NIR). However, SiGe photodiodes suffer from relatively high dark noise and random noise. Furthermore, SiGe photodiodes may take a relatively long time to charge and/or discharge, causing an increased image lag of the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2A is a schematic side view of a photodiode configured for front side illumination in accordance with an embodiment of the present technology.

FIG. 2B is a graph of Ge ratio along semiconductor substrate of the photodiode shown in FIG. 2A.

FIG. 2C is a graph of electric potential along semiconductor substrate of the photodiode shown in FIG. 2A.

FIG. 3A is a schematic side view of a photodiode configured for front side illumination in accordance with an embodiment of the present technology.

FIG. 3B is a graph of Ge ratio along semiconductor substrate of the photodiode shown in FIG. 3A.

FIG. 3C is a graph of electric potential along semiconductor substrate of the photodiode shown in FIG. 3A.

FIG. 4A is a schematic side view of a photodiode configured for front side illumination in accordance with an embodiment of the present technology.

FIG. 4B is graph of a Ge ratio along semiconductor substrate of the photodiode shown in FIG. 4A.

FIG. 4C is a graph of electric potential along semiconductor substrate of the photodiode shown in FIG. 4A.

FIG. 5A is a schematic side view of a photodiode configured for front side illumination in accordance with an embodiment of the present technology.

FIG. 5B is a graph of Ge ratio along semiconductor substrate of the photodiode shown in FIG. 5A.

FIG. 5C is a graph of electric potential along semiconductor substrate of the photodiode shown in FIG. 5A.

Figure 1:
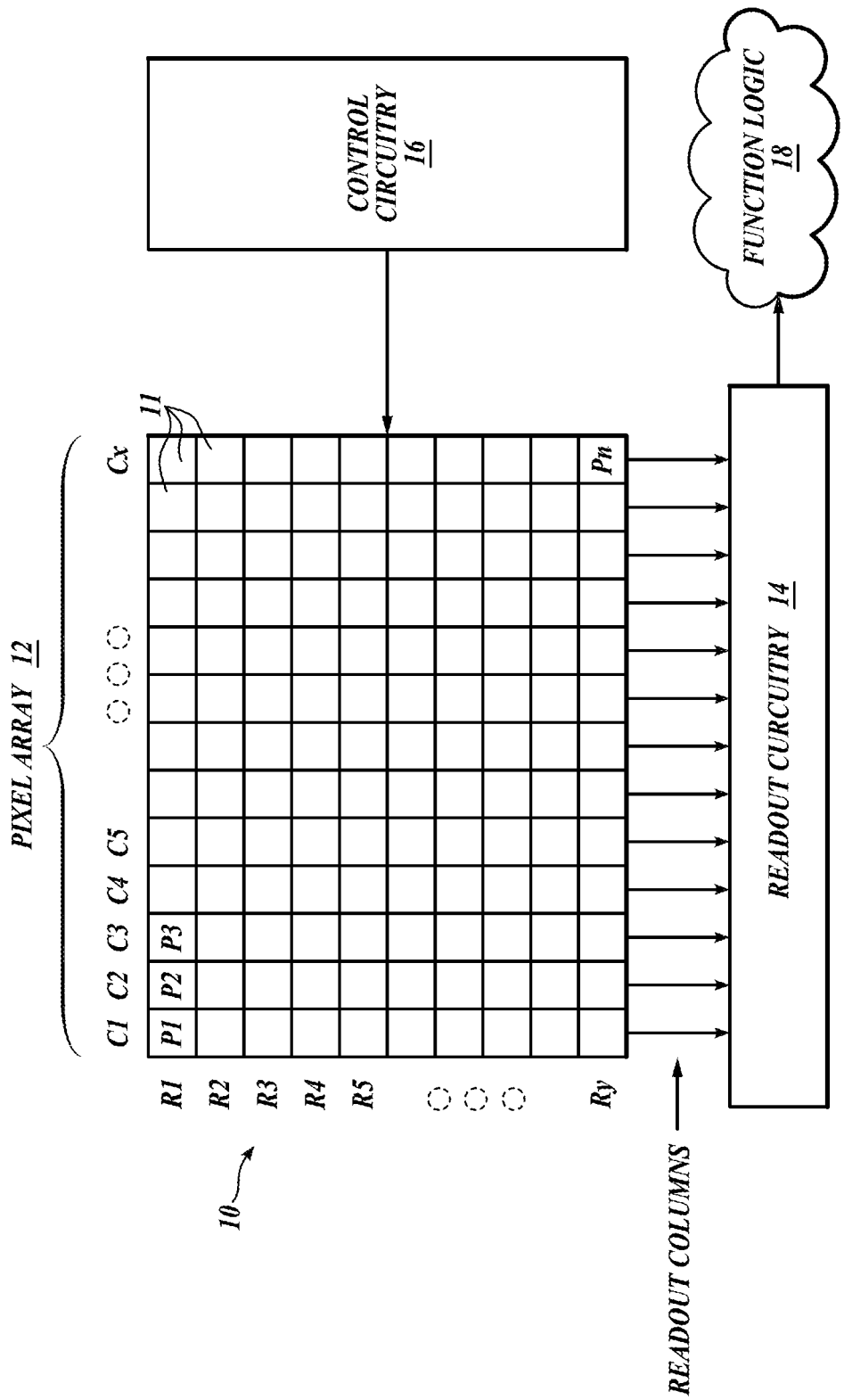
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors include Silicon Germanium (SiGe) layer are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means+/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to photodiodes (also referred to as pixels) that are manufactured on a substrate with layers of silicon (Si) and silicon-germanium (SiGe). Generally, the SiGe layer converts more incoming light into electrical charge than does a comparable Si layer. Stated differently, the SiGe photodiode has higher sensitivity for the incoming light, and particularly with respect to the near infrared light (NIR). However, in many practical application SiGe photodiodes are also characterized by relatively high dark noise and random noise, and also by image lag. For example, the lattice mismatch between the Si layer and the SiGe layer may generate dark noise. Therefore, in some embodiments of the inventive technology, the concentration of Ge in the SiGe layer is changed gradually as $Si_{1-x}Ge_x$, where x varies along the thickness of the SiGe layer (i.e., along the vertical depth in the substrate), thus providing a more gradual change of the crystal lattice to reduce lattice mismatch and the resulting dark noise. In some embodiments, x can range between 0 and 1. In different embodiments, the image sensors may be front side illuminated or backside illuminated image sensors.

In some embodiments, the photodiode spreads over both the Si and the $Si_{1-x}Ge_x$ layers. Such spread of the photodiode positions a location of the deepest potential at a shallow point, which is either within the Si layer or close to the interface between the Si layer and the $Si_{1-x}Ge_x$ layer (i.e., in the region where Ge ratio changes). Such location of the deepest potential point creates a "crest" in the potential well of the photodiode. Generally, when the highest peak (crest) is in a shallow position with respect to a front side surface (or non-illuminated surface) of the semiconductor material, charges can be transferred easily and completely from photodiode to the corresponding floating diffusion (FD).

FIG. 1 is a diagram of an example image sensor 10 in accordance with an embodiment of the present technology. The image sensor 10 includes pixels 11 that are arranged in rows (R) and columns (C) of a pixel array 12. When the image sensor 10 is exposed to light, the individual pixels 11 (also referred to as photodiodes) generate certain voltage values in response to light. After each pixel has generated corresponding voltage value in response to the amount light absorbed, the image data is readout by a readout circuitry 14, and then transferred to a function logic 18.

Voltage values of the individual pixels ($P_1$-$P_n$) can be captured by the readout circuitry 14. For example, a control circuitry 16 may determine a specific row $R_i$ of the pixel array 12 for coupling with the readout circuitry 14. After the pixel values in row $R_i$ are captured, the control circuitry 16 may couple row $R_{i+1}$ with the readout circuitry 14, and the process repeats until voltage values of all the pixels in the column are captured. In other embodiments, the readout circuitry 14 may readout the image data using a variety of other techniques (not illustrated in FIG. 1), such as a serial readout or a full parallel readout of all pixels simultaneously. In different embodiments, the readout circuitry 14 may include amplification circuitry, analog-to-digital conversion ("ADC") circuitry, or other circuitry. In some embodiments, the pixel values are captured and processed by the function logic 18. Such processing may, for example, include image processing, image filtering, image extraction and manipulation, determination of light intensity, etc.

FIG. 2A is a schematic side view of a photodiode 36 configured for front side illumination in accordance with an embodiment of the present technology. A semiconductor substrate 80 includes an epitaxial Si layer 86, over which a $Si_{1-x}Ge_x$ layer 84 and a Si layer 82 are formed. In many embodiments, the $Si_{1-x}Ge_x$ layer 84 includes a gradually changing concentration of Ge, as explained in more details with respect to FIG. 2B. In some embodiments, the Si layer 82 is about 0.1 μm thick, the $Si_{1-x}Ge_x$ layer is about 2-5 μm thick, and the epitaxial silicon layer 86 is about 1-4 μm thick.

In some embodiments, the photodiode 36 includes a first doped region 34 (e.g., a highly doped P-region) and a second doped region 32 (e.g., an N-doped region). The second doped region 32 is formed to extend form Si layer 82 into the SiGe layer 84. In other embodiments, the first doped region 34 may be a highly doped N-region and the second doped region 32 may be a P-doped region. In some embodiments, the second doped region 32 and the first doped region 34 form a depletion region across the Si layer 82 and SiGe layer 84, which functions as charge generation region 32a of the photodiode 36. In operation, incoming light 20 impinges upon the photodiode 36, for example during an integration period of image sensor 10) and the photodiode 36 photogenerates charges in charge generation region 32a and accumulates electrical charges in the second doped region 32. These electrical charges are subsequently drained into the supporting electronics of the photodiode through, for example, a floating diffusion (FD) 48 by a transfer transistor. For example, when a transfer gate 46 of the transfer transistor is turned on (e.g., by a transfer signal of positive voltage), thus forming a conduction channel between the second doped region 32 of the photodiode 36 and the floating diffusion (FD) 48, photogenerated electrical charges are transferred from the second doped region 32 to the floating diffusion (FD) 48 for subsequent signal read out. In an embodiment, the transfer gate 46 may be a planar gate electrode or a planar gate electrode and a vertical gate electrode. In some embodiments, the second doped region 32 may extend to about 1 μm into semiconductor substrate 80.

In one embodiment, the photodiode 36 may further include a third doped region 35 (e.g., heavily doped P-region) disposed between the second doped region 32 and a front side surface 321 of the Si layer 82. In one embodiment, the third doped region 35 is disposed in the Si layer 82, for example by ion implantation. In operation, the third doped region 35 passivates interface between Si layer 82 and gate oxide layer 33, i.e., oxide-silicon interface to reduce dark current. In some embodiments, the third doped region 35 laterally extended toward the transfer gate covering the entire surface of photodiode. In some embodiments, the third doped region 35 extends to an edge of the transfer gate close to the second doped region and does not form underneath the transfer gate. In one example, the third doped region 35 is grounded. In an embodiment where the polarity of dopant is reversed, i.e., first doped region 34 is a highly doped N-region and the second doped region 32 is P-doped region, the third doped region 35 is a heavily doped N-region, which may be biased with zero or positive voltage.

FIG. 2B is a graph of Ge ratio along the semiconductor substrate 80 of the photodiode shown in FIG. 2A. The vertical axis of the graph corresponds to the depth or thickness of the semiconductor substrate 80 in μm. The horizontal axis of the graph corresponds to the ratio (fraction or "x" in the $Si_{1-x}Ge_x$) of the Ge in the semiconductor substrate 80. The ratio x of Ge starts at zero or close to zero (i.e., the SiGe layer having very low or zero Ge concentration) at the first face 321 of the charge generation region 32a in the Si layer 82, and increases to about 0.7 at a certain depth into the $Si_{1-x}Ge_x$ layer 84 (e.g., at about 2 μm). In the illustrated embodiment, the ratio x remains generally constant for a certain depth, and then gradually decreases back to zero at the interface between the epitaxial Si layer 86 and the $Si_{1-x}Ge_x$ layer 84. The ratio x corresponds to about 0.7 at the second face 322 of the charge generation region 32a, which may be about 1 μm deep into the semiconductor substrate 80. Such a small thickness of the second doped region 32 results in a strong electric field and shorter transfer path providing a relatively high speed of the response of the photodiode 36. A relatively gradual change in the ratio x in the $Si_{1-x}Ge_x$ layer tends to suppress lattice mismatch, which in turn decreases dark noise. In some applications, the Ge ratio of 0.7 results in a relatively high sensitivity to the 1.5 μm wavelength, corresponding to near infrared light (NIR). In some embodiments, x can range between 0 and 1. It is appreciated that the configuration of Ge ratio and the position of peak Ge concentration in the semiconductor substrate 80 may vary depend on image sensor application (e.g., the sensitivity to specific light wavelength) and an overall thickness of semiconductor substrate 80.

FIG. 2C is a graph of electric potential along the semiconductor substrate of the photodiode shown in FIG. 2A. The vertical axis of the graph correspondence to the depth or thickness of the semiconductor substrate 80 in μm. The horizontal axis corresponds to a potential in V. Since the second doped region 32 of the photodiode 36 is formed inside both the Si layer 82 and the $Si_{1-x}Ge_x$ layer 84, the highest potential point of the photodiode 36 is positioned relatively shallow either within the Si layer 82 or within the $Si_{1-x}Ge_x$ layer 84 where Ge ratio x changes. The shallow position of the highest potential point of the photodiode 36, which is either within the Si layer or within the $Si_{1-x}Ge_x$ layer 84 where Ge ratio x changes, improves a completeness of the transfer of electrical charge from the diode. For an example, for a 6 μm thickness of semiconductor substrate 80, the highest potential point of the photodiode 36 may be located at a position of no more than 0.2 μm with respect to a front side surface of the semiconductor substrate 80 depending on the doping concentration and implantation depth of the second doped region 32.

FIG. 3A is a schematic side view of a photodiode 36 configured for front side illumination in accordance with an embodiment of the present technology. Analogously to the embodiment shown in the FIG. 2A above, a semiconductor substrate 80 includes the epitaxial silicon layer 86, over which the $Si_{1-x}Ge_x$ layer 84 and the Si layer 82 are formed. In the illustrated embodiment, the Si layer 82 is about 0.3 μm thick, the $Si_{1-x}Ge_x$ layer is about 3-5 μm thick, and the epitaxial Si layer 86 is about 1-3 μm thick. In some embodiments, the photodiode 36 extends about 4 μm into the Si layer 82 and the $Si_{1-x}Ge_x$ layer 84. In some embodiments, x can range between 0 and 1.

The incoming light 20 illuminates the photodiode 36 from its front surface, e.g., the first face 321 of semiconductor substrate 80. In operation, incoming light 20 impinges upon the photodiode 36, for example during an integration period of image sensor 10) and the photodiode 36 photogenerates charges in charge generation region 32a and accumulates electrical charges in the second doped region 32. These electrical charges are subsequently drained into the supporting electronics of the photodiode through, for example, a floating diffusion (FD) 48 by a transfer transistor.

FIG. 3B is a graph of a Ge ratio along the semiconductor substrate 80 of the photodiode shown in FIG. 3A. The vertical and horizontal axes of the graph are analogous to those of FIG. 2B. The ratio x of Ge remains zero or close to zero between the first face 321 of the charge generation region 32a and an interface 323 between the Si layer 82 and the SiGe layer 84. The ratio x of Ge increases to about 0.7 between heights (depths) 324 and 325 of the SiGe layer 84. The height 325 is adjacent to the second face 322 of the charge generation region 32a, which may be about 4 μm deep into the semiconductor substrate 80 with respect to the illuminated surface (e.g., the first surface 321) of the semiconductor substrate 80. The ratio x of Ge stays generally constant at about 0.7 through the $Si_{1-x}Ge_x$ layer 84 (i.e., between the heights 324 and 325), and then gradually reverts back to zero at the interface 326 of the $Si_{1-x}Ge_x$ layer 84 and Si layer 86. The illustrated the charge generation region 32a of the photodiode 36, which is a depletion region formed between the first doped region 34 and the second doped region 32, is formed relatively deep into the $Si_{1-x}Ge_x$ layer 84, therefore increasing the sensitivity of the photodiode to incoming light. As explained with respect to FIG. 2B, the Ge ratio of 0.7 results in relatively high sensitivity to the 1.5 μm wavelength, corresponding to NIR. FIG. 3C is a graph of electric potential along semiconductor substrate of the photodiode shown in FIG. 3A. The vertical and horizontal axes of the graph are analogous to those of FIG. 2C. In the illustrated embodiment, the highest potential of the photodiode 36 is proximate to the interface between the Si layer 82 and the $Si_{1-x}Ge_x$ layer 84. This highest potential gradually decreases to about zero at the second face 322 of the photodiode 36.

In one embodiment, a P-type doped region (e.g., a third doped region) can be formed between a front side (e.g., first face 321) of semiconductor substrate 80 and the second doped region 32 to passivate a silicon-oxide interface therebetween by doping the Si layer 82 of semiconductor substrate 80 with P-type impurities via ion implantation.

FIG. 4A is a schematic side view of a photodiode 36 configured for front side illumination in accordance with an embodiment of the present technology. Analogously to the embodiment shown in the FIGS. 2A and 3A above, the semiconductor substrate 80 includes the epitaxial silicon layer 86, over which the $Si_{1-x}Ge_x$ layer 84 and the Si layer 82 are formed. In the illustrated embodiment, the Si layer 82 is about 0.1 μm thick, the $Si_{1-x}Ge_x$ layer is about 2-5 μm thick, and the epitaxial silicon layer 86 is about 1-4 μm thick. In some embodiments, the second doped region 32 of the photodiode 36 extends about 1 μm into the Si layer 82 and the $Si_{1-x}Ge_x$ layer 84. The incoming light 20 illuminates the front surface (i.e., the first surface 321) of the photodiode 36.

FIG. 4B is a graph of a Ge ratio along the semiconductor substrate 80 of the photodiode shown in FIG. 4A. The vertical and horizontal axes of the graph are analogous to those of FIGS. 2B and 3B above. The ratio x of Ge starts from zero or close to zero at the first face 321 of the charge generation region 32a in the Si layer 82, and peaks at about 0.15 in the lower half of the charge generation region 32a, proximate to the second face 322. With the illustrated embodiment, the charge generation region 32a terminates in the zone of maximum ratio x of Ge (i.e., at x of about 0.15). Outside of the second doped region 32, the x stays constant at about 0.15, and gradually decrease back to zero at the interface of the $Si_{1-x}Ge_x$ layer 84 and Si layer 86. Such a ratio x of Ge may be suitable for the incoming light having the wavelength of 0.94 μm, which is also NIR light, but in some scenarios being a more representative of the atmospheric NIR light. In some embodiments, x can range between 0 and 1. In some embodiments, this ratio x may be favorable for dark noise suppression.

FIG. 4C is a graph of electric potential along semiconductor substrate of the photodiode shown in FIG. 4A. The vertical and horizontal axes of the graph are analogous to those of FIGS. 2C and 3C. In the illustrated embodiment, the highest potential point of the photodiode 36 is positioned proximate to the interface between the Si layer 82 and the $Si_{1-x}Ge_x$ layer 84. This highest potential gradually decreases to about zero at the second face 322 of the photodiode 36.

FIG. 5A is a schematic side view of a photodiode 36 configured for front side illumination in accordance with an embodiment of the present technology. In the illustrated embodiment, the Si layer 82 is about 0.3 μm thick, the $Si_{1-x}Ge_x$ layer is about 3-5 μm thick, and the epitaxial silicon layer 86 is about 1-3 μm thick. In some embodiments, the photodiode 36 extends about 4 μm into the Si layer 82 and the $Si_{1-x}Ge_x$ layer 84, e.g., the charge generation region 32a is formed across the Si layer 82 and the $Si_{1-x}Ge_x$ layer 84. The incoming light 20 illuminates the front surface (i.e., the first surface 321) of the photodiode 36.

FIG. 5B is a graph of Ge ratio along the semiconductor substrate 80 of the photodiode shown in FIG. 5A. The ratio x of Ge in the $Si_{1-x}Ge_x$ layer 84 starts from zero or close to zero at the interface with the Si layer 82, and peaks at about 0.15 in the lower half of the second doped region 32, proximate to the second face 322. With the illustrated embodiment, the second doped region 32 terminates in the zone where the ratio x of Ge already decreases toward zero at the interface with the Si layer 86. Such a ratio x may be suitable for the incoming light having the wavelength of 0.94 μm. The illustrated photodiode 36 is formed relatively deep into the $Si_{1-x}Ge_x$ layer 84, therefore increasing the sensitivity of the photodiode to the incoming light. In some embodiments, x can range between 0 and 1.

FIG. 5C is a graph of electric potential along semiconductor substrate of the photodiode shown in FIG. 5A. In the illustrated embodiment, the highest potential point of the photodiode 36 is positioned proximate to the interface between the Si layer 82 and the $Si_{1-x}Ge_x$ layer 84. This highest potential gradually decreases to about zero at the second face 322 of the second doped region 32. Such a shape of the potential along the relatively deep second doped region 32 may increase sensitivity of the second doped region 32.

FIGS. 6A-6E illustrate steps of a manufacturing process of an example image sensor in accordance with an embodiment of the present technology. In some embodiments, the method may include only some of the steps in the flowchart or may include additional steps that are not illustrated in the flowchart 400.

In step one (FIG. 6A), the manufacturing process starts with a semiconductor substrate 80 that is P-doped. The semiconductor substrate 80 is attached to the silicon substrate 100. As explained above, a portion of the semiconductor substrate 80 is formed of a stack epitaxial layers of silicon layer 82, $Si_{1-x}Ge_x$ layer 84 and silicon layer 86 by epitaxial growth process. As one example, the material of the semiconductor substrate is Si. However, one skilled in the art will appreciate that any group III elements (B, Al, Ga, In, Tl), group IV elements (C, Si, Ge, Sn, Pb), group V elements (N, P, As, Sb, Bi), and suitable combinations of these elements, may be used to form the semiconductor substrate 80. In some embodiments, the P-type dopant may be Boron.

In step two (FIG. 6B), a portion of the semiconductor substrate 80 is N-doped to form a second doped region 32 across the Si layer and SiGe layer by ion implantation with various implant energies. Some examples of dopants of the N-type are Arsenic and Phosphorus. Generally, doping of the second doped region 32 is heavier than that of the first doping region 34. In some embodiments, the arrangement of the dopants may be inverted, that is, the second doped region 32 may be a heavily-doped P-type region whereas the first doped region 34 is a lightly doped N-type region. Isolation elements 49 may formed by ion implantation of P-doped dopant forming a P-type isolation well in the semiconductor substrate 80. A single second doped region 32 is illustrated, however the semiconductor substrate wafer generally includes multiple second doped region 32 for different pixels (e.g., four second doped region 32 per pixel, multiple pixels per light sensor, and multiple sensors per wafer). Furthermore, the gate oxide layer 33 (e.g., $SiO_2$) and a polysilicon layer 30 are formed over the semiconductor substrate 80.

In step three (FIG. 6C), a portion of the polysilicon layer 30 is removed to form a gate electrode 31. In different embodiments, forming the gate electrode 31 may include different manufacturing steps, for example, mask deposition, optically exposing the mask, etching, material deposition, etc.

In step four (FIG. 6D), the metal interconnection layers 28 having metal interconnect conductors 59 and dielectric material are formed. In some examples, the dielectric material may include oxides/nitrides such as silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art will recognize that other stoichiometric combinations of the above metals/semiconductors and their oxides/nitrides/oxynitrides may be used, as long as they have a refractive index smaller than the refractive index of the semiconductor material, in accordance with the teachings of the present technology. The metal conductors may be formed using, for example, copper or aluminum. In different embodiments, forming the metal interconnect conductors 59 may include different manufacturing steps, for example, mask deposition, optically exposing the mask, etching, material deposition, etc.

In step five (FIG. 6E), a passivation layer 26 is formed proximate to the dielectric layers 28. In different embodiments, the passivation layer 26 may include silicon oxide or nitride. In some embodiments, a bandpass filter 24 may be formed proximate to the passivation layer 26. Some embodiments of the bandpass filter are explained in more details with respect to FIGS. 10A-10B below. In some embodiments, a microlens 22 may be formed proximate to the bandpass filter 24. In operation, the incoming light 20 passes through the microlens 22, the bandpass filter 24, the passivation layer 26 and the dielectric layer 28 toward the photodiode 36.

Figure 7:
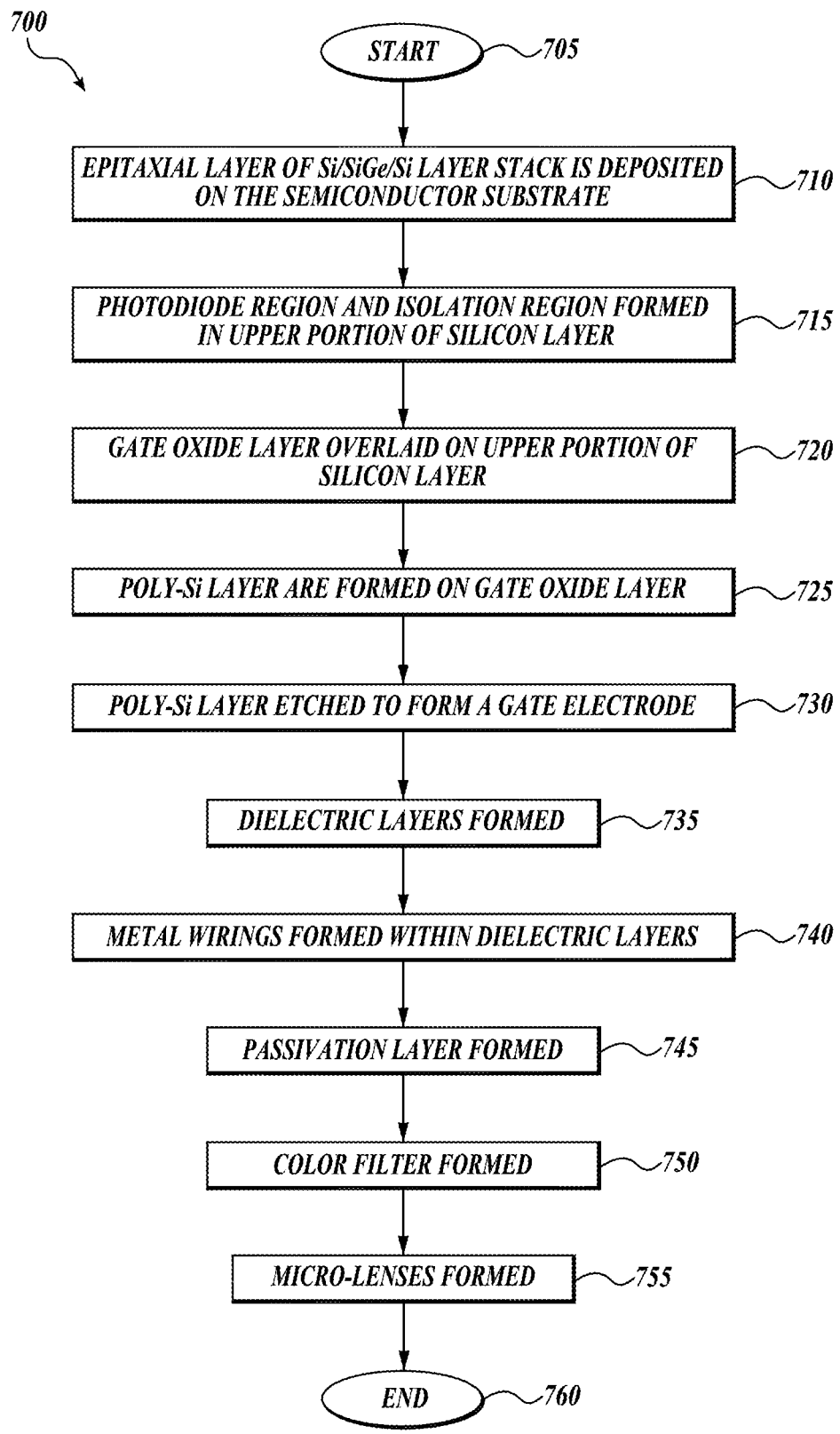
FIG. 7 is a flow diagram of a manufacturing process in accordance with an embodiment of the present technology.

FIG. 7 is a flow diagram of a manufacturing process in accordance with an embodiment of the present technology. In some embodiments, the method may include only some of the steps illustrated in the flowchart or may include additional steps that are not illustrated in the flowchart 700.

The method 700 may be used to fabricate an exemplary pixel 11 of FIG. 1. The method 700 starts in block 705. In block 710, a semiconductor substrate 80 is provided, wherein the semiconductor substrate 80 may be a silicon substrate, doped semiconductor substrate such as P-type or n-type doped semiconductor substrate or a bulk substrate. The epitaxial layers of silicon layer 82, $Si_{1-x}Ge_x$ layer 84 and silicon layer 86 is formed on the semiconductor substrate 80, for example by epitaxial growth. In different embodiments, the $Si_{1-x}Ge_x$ layer 84 may include different distributions of Ge, i.e., different ratios of x along the thickness of the $Si_{1-x}Ge_x$ layer, where in x can range between 0 and 1. The Si layer 82 is formed on the $Si_{1-x}Ge_x$ layer 84. In some embodiments, the $Si_{1-x}Ge_x$ layer 84 and the Si layer 82 are lightly doped with P-dopant. In some embodiments, the $Si_{1-x}Ge_x$ layer 84 is thicker than the Si layer 82.

In block 715, the photodiode regions (e.g., a second doped region 32 and isolation elements 49) may be formed by doping the semiconductor substrate with N-type impurities and P-type impurities. In some embodiment, isolation elements 49 may be isolation trench structure, for example shallow trench isolation structures. In block 720, a gate oxide layer 33 (e.g., $SiO_2$) is formed on the Si layer 82. In different embodiments, different oxides may be used, like, for example, nitride-oxides. In block 725, a poly-silicon layer 30 is formed over the gate oxide layer 33.

In one embodiment, a P-type doped region (e.g., a third doped region 35) may be formed between a front side of semiconductor substrate 80 and the second doped region 32 by doping the Si layer 82 of semiconductor substrate with P-type impurities via ion implantation.

In block 730, the polysilicon layer 30 is etched to form the gate electrode 31. Additionally, a source/drain region for transistors may be formed by relatively heavy doping of N-dopants into the Si layer 82 and possibly into the $Si_{1-x}Ge_x$ layer 84, depending on the thickness of the Si layer 82.

In block 735, one or more dielectric layers 28 are formed on the gate oxide layer 33 and the gate electrode 31. In block 740, the metal wirings (or metal interconnections structures) 59 are formed within the dielectric layers 28. Forming the gate electrode 31 and/or the metal wirings 59 may include different manufacturing steps, for example, mask deposition, optically exposing the mask, etching, material deposition, etc. The metal wirings 59 may comprise of metallic material such as copper, aluminum, tungsten.

In block 745, the passivation layer 26 (also referred to as the buffer oxide) is formed on the dielectric layers 28. In block 750, the color filter 24 is formed on the passivation layer 26. In operation, the color filter 24 selectively blocks light wavelengths from reaching the photodiode 36. In block 755, the microlenses 22 are formed over the color filters 24. In some embodiments, the microlenses 22 may operatively focus the incoming light 20 onto the N-type doped region 32 of the respective photodiode. The method may end in block 760.

Figure 8C:
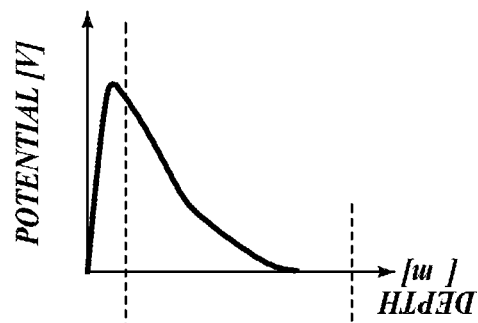
FIG. 8C is a graph of electric potential along semiconductor substrate of the photodiode shown in FIG. 8A.
Figure 8B:
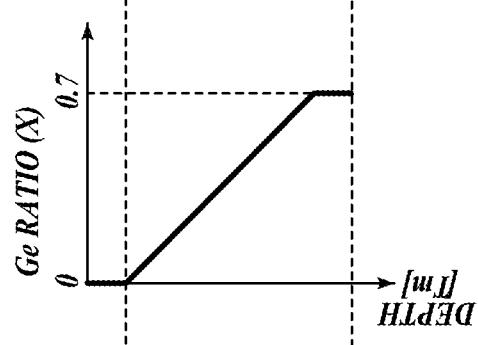
FIG. 8B is a graph of Ge ratio along semiconductor substrate of the photodiode shown in FIG. 8A.
Figure 8A:
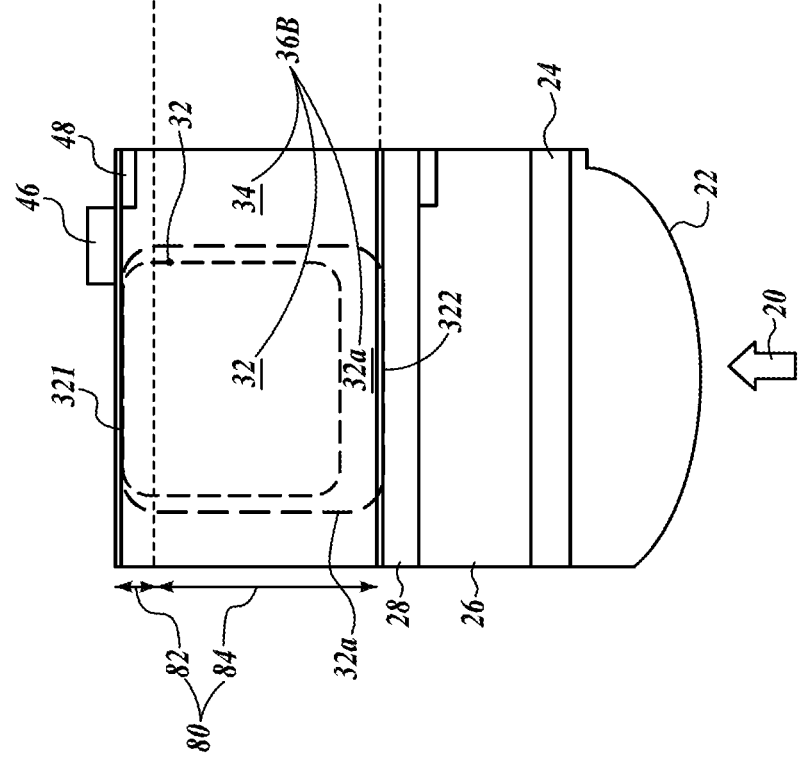
FIG. 8A is a schematic side view of a photodiode configured for backside illumination in accordance with an embodiment of the present technology.

FIG. 8A is a schematic side view of a photodiode 36B configured for backside illumination in accordance with an embodiment of the present technology. The semiconductor substrate 80 includes the SiGe layer 84 and the Si layer 82. In some embodiments, the epitaxial layer 86 is used during the initial steps of manufacturing, and then removed before forming the dielectric layers 28 at the backside of the photodiode. In some embodiments, the Si layer 82 is about 0.1 μm thick and the $Si_{1-x}Ge_x$ layer is about 0.9 μm thick.

In some embodiments, the photodiode 36B includes the first doped region 34 (e.g., a highly doped P region) that extends substantially through the entire thickness of the Si layer 82 and the $Si_{1-x}Ge_x$ layer 84. The second doped region 32 may be an N-doped region resulting from an earlier step of lightly doping a combination of the Si layer 82 and the $Si_{1-x}Ge_x$ layer 84. In other embodiments, doping of the first doped region 34 and the second doped region 32 may be reversed. For example, the first doped region 34 may be an N-doped region and the second doped region 32 may be a P-doped region. In operation, incoming light 20 passes through the microlens 22 and the color filter 24 to impinge on the charge generation region 32a through its second face 322, and photogenerates charges accumulated in the second doped region 32. The charge generation region 32a is formed across the Si layer 82 and the $Si_{1-x}Ge_x$ layer 84.

In one embodiment, the photodiode 36B may further include a third doped region (not shown in FIG. 8A), for example heavily doped P-region disposed between the second doped region 32 and a front side surface 321 of the Si layer 82. In one embodiment, the third doped region is disposed in the Si layer 82, for example by ion implantation. The third doped region passivates interface between Si layer 82 and gate oxide layer 33, i.e., oxide-silicon interface to reduce dark current.

FIG. 8B is a graph of Ge ratio along the semiconductor substrate 80 of the photodiode shown in FIG. 8A. The vertical axis of the graph corresponding to the depth or thickness of the semiconductor substrate 80 in μm. The horizontal axis of the graph corresponds to the ratio x of the Ge in the semiconductor substrate 80. The ratio x of Ge starts from zero or close to zero at the first face 321 of the second doped region 32 in the Si layer 82, and increases to about 0.7 at the second face 322 of the second doped region 32. In some embodiments, x can range between 0 and 1. In the illustrated embodiment, the ratio x remains generally constant proximate to the second face 322. In some applications, the Ge ratio of 0.7 results in a relatively high sensitivity to the 1.5 μm wavelength, corresponding to near infrared light (NIR). Furthermore, a backside illumination configuration coupled with a relatively high speed of the response of the photodiode 36B, may make the illustrated photodiode suitable for a time-of-flight (ToF) use.

FIG. 8C is a graph of electric potential along the semiconductor substrate of the photodiode shown in FIG. 8A. The vertical axis of the graph corresponds to the depth or thickness of the semiconductor substrate 80 in μm. The horizontal axis corresponds to a potential in V. The highest potential point of the photodiode 36B is shallow positioned either within the Si layer or within the $Si_{1-x}Ge_x$ layer 84, where Ge ratio x changes. As with the front side illumination embodiments, the highest potential point of the photodiode 36B creates a "crest" of the well at a shallow position with respect to front side surface, thus improves a completeness of the transfer of photogenerated electrical charge from the photodiode 36B to the associated floating diffusion (FD) 48.

Figure 9C:
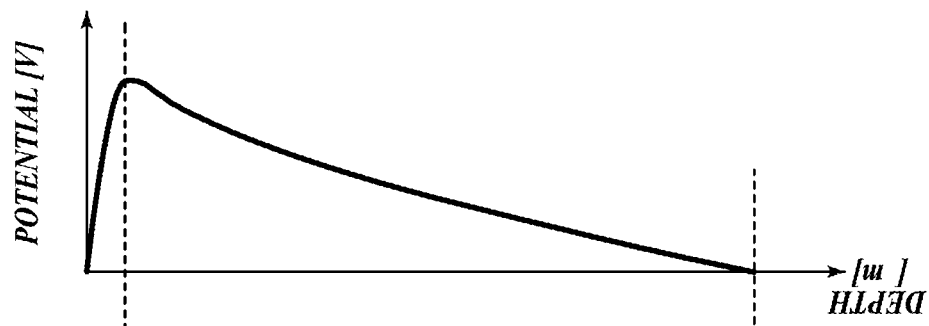
FIG. 9C is a graph of electric potential along semiconductor substrate of the photodiode shown in FIG. 9A.
Figure 9B:
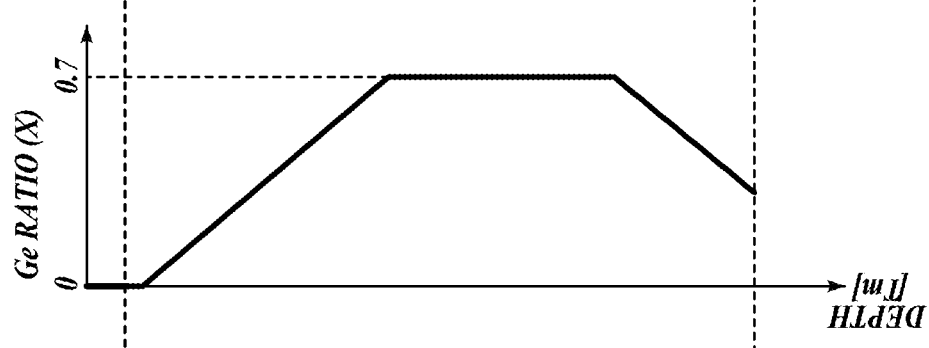
FIG. 9B is a graph of Ge ratio along semiconductor substrate of the photodiode shown in FIG. 9A.
Figure 9A:
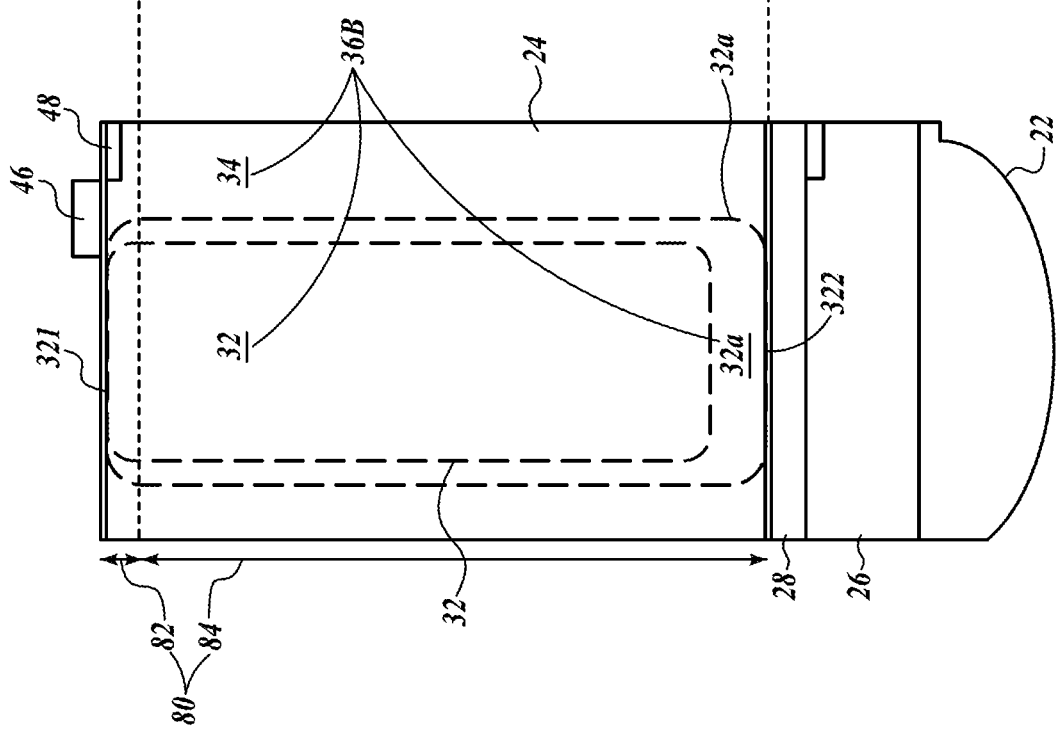
FIG. 9A is a schematic side view of a photodiode configured for backside illumination in accordance with an embodiment of the present technology.

FIG. 9A is a schematic side view of a photodiode 36B configured for backside illumination in accordance with an embodiment of the present technology. In the illustrated embodiment, the Si layer 82 is about 0.3 μm thick and the $Si_{1-x}Ge_x$ layer is about 4 μm thick. The incoming light 20 illuminates the photodiode 36B at its backside surface, i.e., at the second face 322 and photogenerates charges that is accumulated in the second dope region 32 of the photodiode 36B. As with the embodiment illustrated in FIG. 8A, the epitaxial layer 86 may be used during the manufacturing, and then subsequently removed before forming the dielectric layers 28 at the backside of the photodiode 36B.

FIG. 9B is a graph of Ge ratio along the semiconductor substrate 80 of the photodiode shown in FIG. 9A. The ratio x of Ge starts from zero or close to zero at the first face 321 of a charge generation region 32a in the Si layer 82, where the charge generation region 32a is a depletion region formed between the first doped region 32 and the second doped region 34. Next, the ratio x of Ge stays generally constant for a certain thickness through the $Si_{1-x}Ge_x$ layer 84, then decreases gradually and goes back to zero at the second face 322 of charge generation region 32a. In some embodiments, x can range between 0 and 1. The second doped region 32 is implanted to be formed across the Si layer 82 and the $Si_{1-x}Ge_x$ layer 84. The illustrated photodiode 36B is formed relatively deep into the $Si_{1-x}Ge_x$ layer 84, therefore increasing the sensitivity of the photodiode 36B to the incoming light. In at least some embodiments, a relatively high sensitivity of the photodiode 36B makes it suitable for use in security devices.

FIG. 9C is a graph of electric potential along semiconductor substrate of the photodiode shown in FIG. 9A. In the illustrated embodiment, the highest potential point of the photodiode 36B is positioned proximate to the interface between the Si layer 82 and the $Si_{1-x}Ge_x$ layer 84. This highest potential gradually decreases to about zero at the second face 322 of the photodiode 36B.

Figure 6C:
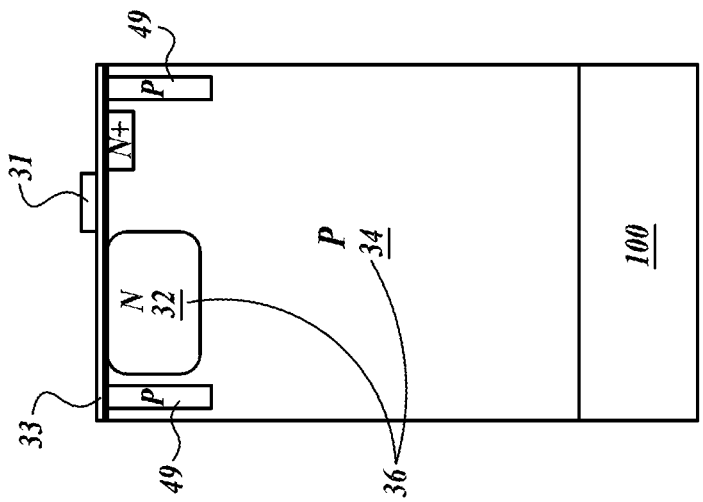
FIGS. 6A-6E illustrate steps of a manufacturing process for a sample image sensor in accordance with an embodiment of the present technology.
Figure 6B:
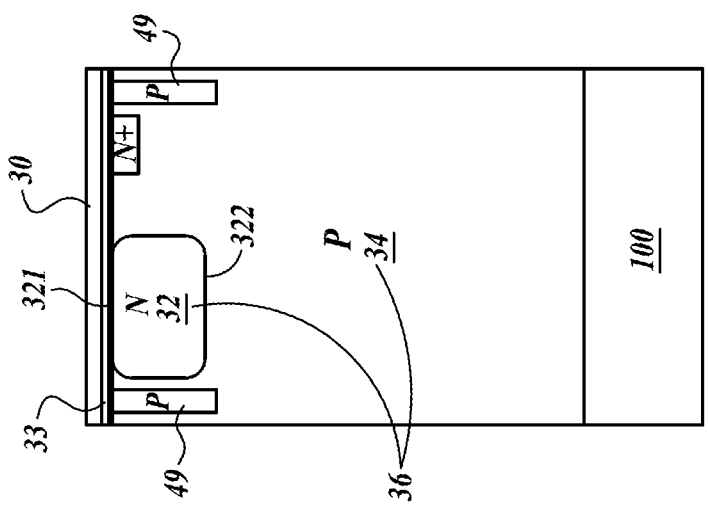
Figure 6A:
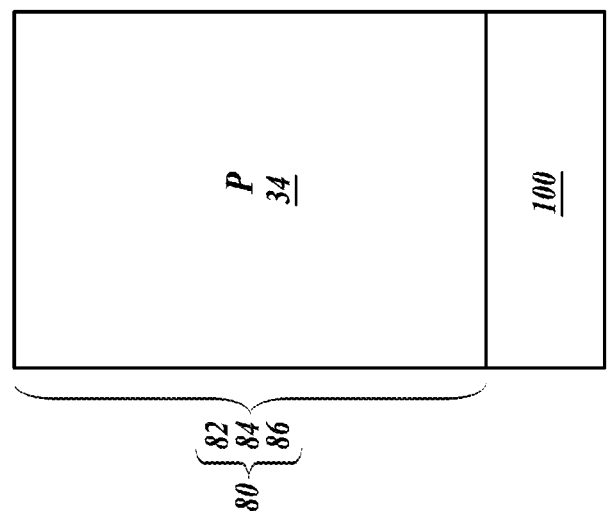
Figure 6E:
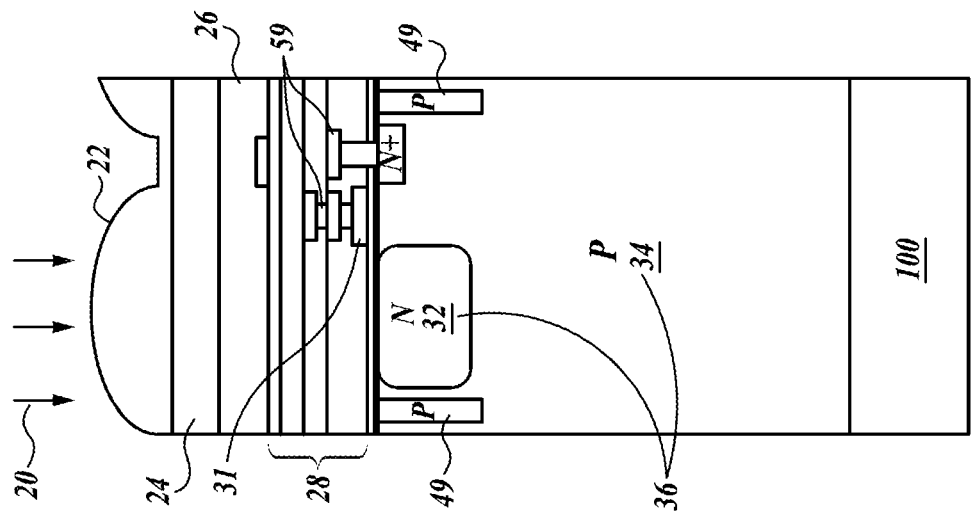
Figure 6D:
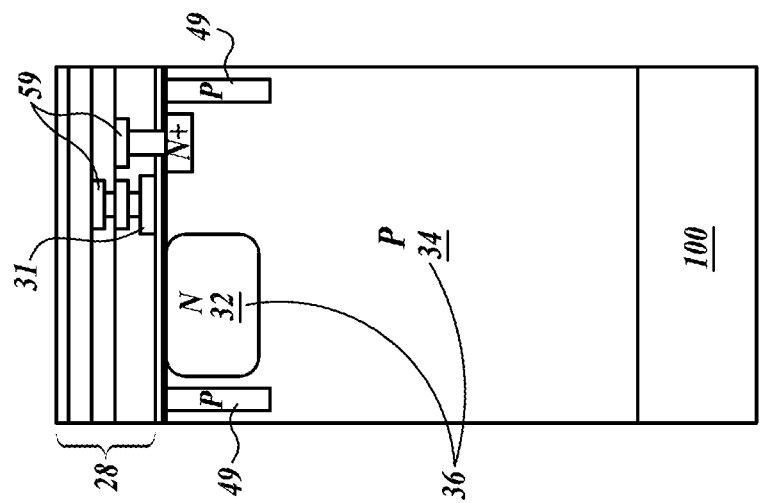
Figures 10A, 10B, 10C:
FIGS. 10A-10C illustrate color filters in accordance with the present technology.

FIGS. 10A-10C illustrate color filters 24 in accordance with the present technology. The color filters may be arranged as shown in FIG. 6E (front side illumination) and FIG. 8A, (backside illumination). In some embodiments, two or more different color filters 24-i may be combined into a stack for a given photodiode or an array of photodiodes.

FIG. 10A illustrates an array of black-and-white (B/W) filters 24-1 used with black-and-white cameras. In some embodiments, the B/W filters 24-1 pass all visible light toward corresponding photodiodes 36 or 36B. FIG. 10B illustrates an array of color filters 24-2 used for the NIR detection. In some embodiments, the color filters 24-2 filter out visible light, while passing the NIR light through. FIG. 10C illustrates an array of color filters 24-3 used for NIR and visible light detection. Generally, the light filters G allow the green light wavelengths through, while blocking other wavelengths; the light filters R allow the red light through, the light filters B allow the blue light through, and the light filters N allow the NIR light through. In some embodiments, the combination of the G, R, B and N light filters may be selected to match an expected distribution of the wavelengths under certain use scenarios.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a plurality of pixels arranged in rows and columns of a pixel array disposed in a semiconductor substrate, wherein photodiodes of an individual pixel are configured to receive an incoming light through an illuminated surface of the semiconductor substrate,
wherein the semiconductor substrate comprises:
a first layer of semiconductor material comprising silicon (Si); and
a second layer of semiconductor material comprising silicon germanium ($Si_{1-x}Ge_x$), wherein a concentration x of Ge changes gradually through at least a portion of thickness of the second layer,
wherein each photodiode comprises:
a first doped region extending through the first layer of semiconductor material and the second layer of semiconductor material; and
a second doped region extending through the first layer of semiconductor material and the second layer of semiconductor material,
wherein the semiconductor substrate further comprises a third layer of semiconductor material comprising silicon, and wherein the second layer of semiconductor material is disposed between the first layer of semiconductor material and the third layer of semiconductor material, and
wherein the second layer of semiconductor material has a first side facing the first layer of semiconductor material, and a second side facing the third layer of semiconductor material, wherein the concentration x of Ge in the second layer of semiconductor material changes from a first minimum value at the first side, through a maximum value inside the second layer of semiconductor material, and to a second minimum value at the second side of the second layer of semiconductor material.

2. The image sensor of claim 1, wherein the image sensor is a front side illuminated sensor, and wherein the illuminated surface of the semiconductor is on the first layer of semiconductor material.

3. The image sensor of claim 1, wherein the maximum value of the concentration x of Ge inside the second layer of semiconductor material is configured based on at least the thickness of semiconductor material and the sensitivity to a specific light wavelength.

4. The image sensor of claim 1, wherein each pixel further comprises a lens and a band pass filter disposed proximate to the first layer of semiconductor material.

5. The image sensor of claim 4, wherein the band pass filter is a near infrared (NIR) filter.

6. The image sensor of claim 1, wherein each photodiode further includes a charge generation region disposed across the first layer of semiconductor material and the second layer of semiconductor material, each photodiode operatively generates charges in the charge generation region in response to the incoming light.

7. The image sensor of claim 1, wherein the image sensor is a backside illuminated sensor, and wherein the illuminated surface of the semiconductor substrate is on the second layer of semiconductor material.

8. The image sensor of claim 7, wherein the second layer of semiconductor material has a first side facing the first layer of semiconductor material, and a second side facing away from the first side, wherein the concentration x of Ge in the second layer of semiconductor material changes from a minimum value at the first side thereof, to a maximum value at the second side of the second layer of semiconductor material.

9. The image sensor of claim 7, wherein the second layer of semiconductor material has a first side facing the first layer of semiconductor material, and a second side facing the third layer of semiconductor material, wherein the concentration x of Ge in the second layer of semiconductor material changes from a minimum value at the first side of the second layer of semiconductor material, through a maximum value inside the second layer of semiconductor material, and to an intermediate value at the second side of the second layer of semiconductor material.

10. The image sensor of claim 9, wherein the maximum value of the concentration x of Ge inside the second layer of semiconductor material is about 0.7.

11. The image sensor of claim 9, wherein the maximum value of the concentration x of Ge inside the second layer of semiconductor material extends through a portion of width of the second layer of semiconductor material, wherein the maximum value of the concentration x of Ge is configured based on at least the thickness of semiconductor material and the sensitivity to a specific light wavelength.

12. A method for manufacturing an image sensor, comprising:
providing a semiconductor substrate,
forming an epitaxial layer over the semiconductor substrate, wherein the epitaxial layer comprises:
a first layer of semiconductor material comprising silicon (Si); and
a second layer of semiconductor material comprising silicon germanium ($Si_{1-x}Ge_x$), wherein a concentration x of Ge changes gradually through at least a portion of thickness of the second layer, wherein x lies between zero and one,
wherein the first layer of semiconductor material and the second layer of semiconductor material are doped as a first doped region; and
doping a second doped region, wherein the second doped region extends through the first layer of semiconductor material and through the second layer of semiconductor material,
wherein the second layer of semiconductor material has a first side facing the first layer of semiconductor material, and a second side facing a third layer of semiconductor material, wherein the concentration x of Ge in the second layer of semiconductor material changes from a first minimum value at the first side, through a maximum value inside the second layer of semiconductor material, and to a second minimum value at the second side of the second layer of semiconductor material.

13. The method of claim 12, further comprising:
forming a gate oxide layer proximate to the first layer of semiconductor material; and
forming at least one dielectric layer proximate to the gate oxide layer.

14. The method of claim 12, wherein the process of forming the epitaxial layer further comprises:
forming a third layer of semiconductor material comprising silicon (Si) on the semiconductor substrate, wherein the second layer of semiconductor material is between the first layer of semiconductor material and the third layer of semiconductor material, and wherein the third layer of semiconductor material is proximate to the silicon substrate.

15. The method of claim 14, further comprising:
forming at least one lens and at least one band pass filter proximate to the first layer of semiconductor material.

16. The method of claim 15, wherein the band pass filter is a near infrared (NIR) filter.

17. The method of claim 12, further comprising:
forming at least one lens and at least one band pass filter proximate to the second layer of semiconductor material.

18. An image sensor, comprising:
a plurality of pixels arranged in rows and columns of a pixel array disposed in a semiconductor substrate, wherein each individual pixel includes a photodiode operative to receive an incoming light through an illuminated surface of the semiconductor substrate,
wherein the semiconductor substrate comprises:
a first layer of semiconductor material comprising silicon (Si);
a second layer of semiconductor material comprising silicon germanium ($Si_{1-x}Ge_x$); and
a third layer of semiconductor material comprising silicon (Si), wherein the second layer of semiconductor material is disposed between the first layer of semiconductor material and the third layer of semiconductor material;
wherein a concentration x of Ge changes gradually from a first minimum value at a first border between the first layer of semiconductor material and the second layer of semiconductor material, through a maximum value at a depth inside the second layer of semiconductor material, and to a second minimum value at a second border between the second layer of semiconductor material and the third layer of semiconductor material.

19. The image sensor of claim 18, wherein the photodiode is formed in the first layer of semiconductor material and the second layer of semiconductor material.

20. The image sensor of claim 18, wherein the concentration x of Ge stays constant at the maximum value through a portion of thickness of the second layer of semiconductor material.

21. The image sensor of claim 18, wherein the maximum value of the concentration x of Ge inside the second layer of semiconductor material is configured based on at least a thickness of semiconductor material and the sensitivity to a specific light wavelength, and wherein a thickness of the second layer of semiconductor material is greater than a thickness of the first layer of semiconductor material.

* * * * *